United States Patent
Nogawa

[19]

[11] Patent Number: 6,154,071
[45] Date of Patent: Nov. 28, 2000

[54] PLL CIRCUIT

[75] Inventor: Hiromichi Nogawa, Yamagata, Japan

[73] Assignee: NEC Corporation, Tokyo, Japan

[21] Appl. No.: 09/141,720

[22] Filed: Aug. 27, 1998

[30]    Foreign Application Priority Data

Aug. 27, 1997  [JP]  Japan ................................ 9-231406

[51] Int. Cl.[7] ................................................. H03L 7/06
[52] U.S. Cl. ................................... 327/156; 327/147
[58] Field of Search ................................. 327/147, 148,
            327/149, 150, 156, 157, 159; 331/14, 15,
            16, 17, 25; 375/373, 374, 375

[56]          References Cited

U.S. PATENT DOCUMENTS 4,200,845  4/1980  Mendenhall et al. .................. 331/1
  5,635,875  6/1997  Kusakabe ................................ 331/1 A
  5,712,532  1/1998  Ogino .................................... 351/1

FOREIGN PATENT DOCUMENTS 4-162263   6/1992  Japan .
  5-37370    2/1993  Japan .
  7-302072  11/1995  Japan .

OTHER PUBLICATIONS

Tsuyama Hioaki, Clock Generating Circuit For Subordinate Synchonizing Network, Patent Abstracts of Japan, vol. 18, No. 549 (E–1618), & JP 06 197101 A (Fujitsu Ltd), Jul. 15, 1994.

Naito Hidefumi, Digital PLL and Synchronizing Separator Circuit, Patent Abstracts of Japan, vol. 097, No. 010 (E–397), Oct. 31, 1997 & JP 09 154037 A (Sony Corp), Jun. 10, 1997.

Takatori Hiroshi, Detection System of Identified Phase, Patent Abstracts of Japan, vol. 10, No. 104 (E–397), Apr. 19, 1986 & JP 60 244130 A (Hitachi Seisakusho KK) Dec. 4, 1985.

Mukumoto Hiroyuki, Digital Phase Locked Loop Circuit, Patent Abstracts of Japan, vol. 012, No. 351 (E–660), Sep. 20, 1988 & JP 63 107231 A (Mitsubishi Electric Corp), May 12, 1988.

Akita Masashi, Digital PLL Circuit, Patent Abstracts of Japan, vol. 13, No. 463 (E–833), Oct. 19, 1989 & JP 01 180118 A (Mitsubishi Electric Corp), Jul. 18, 1989.

*Primary Examiner*—Tuan T. Lam
*Assistant Examiner*—Linh Nguyen
*Attorney, Agent, or Firm*—Foley & Lardner

[57]            ABSTRACT

In a PLL circuit having a phase comparator for detecting a phase difference between a reference signal having a predetermined frequency or a reproduction signal having signal change points at irregular time intervals and a signal to be compared and outputting a phase error signal, a mask circuit controls to transmit or block at least part or all of the phase error signal in accordance with the reference signal or the reproduction signal, an output different from the phase error signal from the phase comparator, and the signal to be compared.

13 Claims, 14 Drawing Sheets

PLL CIRCUIT

BACKGROUND OF THE INVENTION

1. Field of the Invention

The present invention relates to a PLL (Phase-Locked Loop) circuit and, more particularly, to a reproduction PLL circuit used to reproduce an information signal which is converted into a digital signal and recorded on a recording medium such as a tape, a card, or a disk.

2. Description of the Prior Art

Conventionally, a PLL circuit for reproducing an information signal recorded as a digital signal is used to generate a reference clock for reading the recorded digital data. Especially, for a digital signal with change points generated at irregular time intervals, the edge of the digital signal is extracted to generate a pulse signal. By using the spectral component of the repetitive frequency of the pulse signal, a clock can be generated as a continuous pulse signal.

First, problems of a PLL circuit will be described with reference to the block diagram in FIG. 1 showing a well-known conventional PLL circuit of the first prior art.

The PLL circuit shown in FIG. 1 comprises a phase comparator 1201 for outputting a phase error signal proportional to the phase difference between a reference signal and a signal to be compared, a charge pump 1202 for receiving the phase error signal and outputting a current corresponding to the phase error signal, a loop filter 1203 which smoothes the output signal from the charge pump to output a control signal, and serves as an important circuit element for determining the circuit arrangement, the order, and the response characteristics of the PLL circuit, a VCO (Voltage-Controlled Oscillator) 1204 as an oscillator whose output frequency changes depending on the control signal from the loop filter 1203, and a frequency divider 1205 for dividing the output frequency from the VCO 1204.

To realize a short pull-in time in this PLL circuit, the loop gain must be increased to obtain a higher response speed. Once a signal is locked, the PLL circuit must be prevented from being oversensitive to not only normal noise but also noise due to a signal defect to stabilize the PLL circuit. For this purpose, once the PLL circuit is locked, the loop gain must be lowered to lower the response speed.

Generally, the following methods are used to lower the response speed of the PLL circuit.

(1) The gain constant of the phase comparator 1201 is lowered.
(2) The output current from the charge pump 1202 is decreased.
(3) The dumping factor of the loop filter 1203 is increased.
(4) The bandwidth of the loop filter 1203 is narrowed.
(5) The F-V (frequency-voltage) conversion gain constant of the VCO 1204 is lowered.

A PLL circuit for self-clocking, which extracts a clock from a signal recorded on a recording medium such as a magnetic tape or a CD, is disclosed in Japanese Unexamined Patent Publication No. 4-162263.

FIG. 2 is a block diagram of the PLL circuit according to the above second prior art. Referring to FIG. 2, a phase comparator 1301, a loop filter 1303, and a VCO 1304 can be regarded as the same as the phase comparator 1201, the loop filter 1203, and the VCO 1204 of the PLL circuit shown in FIG. 1.

As a characteristic feature of the second prior art, two charge pumps having the same characteristics, i.e., a first charge pump 1302a and a second charge pump 1302b are used.

A monostable multivibrator 1308 is a circuit for outputting a signal of high level for a predetermined period after the rise of a read gate signal. The output signal from the monostable multivibrator 1308 is used to open the gates of AND circuits 1309 and 1310.

The operation of the PLL circuit shown in FIG. 2 will be described next.

The reproduction signal is reproduced from an information recording medium (not shown) such as an optical disk. The read gate signal is generated by a controller (not shown). The read gate signal is output to a switch 1311 and used as a signal for switching a signal S1 to be input to the phase comparator 1301 between the reproduction signal and a predetermined reference clock.

Upon receiving the read gate signal, the monostable multivibrator 1308 outputs a signal S2 which goes high for a predetermined period T after the rise of the read gate signal to the AND circuits 1309 and 1310. The gates of the AND circuits 1309 and 1310 are open for the predetermined period T, so a phase lead signal and a phase lag signal from the phase comparator 1301 are output to the second charge pump 1302b through the AND circuits 1309 and 1310, respectively.

For the period T when the output signal S2 from the monostable multivibrator 1308 is at high level, both the first charge pump 1302a normally operating and the second charge pump 1302b simultaneously operate. For this reason, the sum of the output currents from the first charge pump 1302a and the second charge pump 1302b is twice larger than the output current from the first charge pump 1302a. This increases the loop gain of the PLL circuit, so the response speed of the PLL circuit can be made high. To lower the response speed from this state, the signal S2 is set at low level such that only the first charge pump 1302a can operate.

For this PLL circuit, however, the read gate signal must be generated by the controller outside the PLL circuit. For this reason, this PLL circuit cannot be used to extract a clock from a reproduction signal in a format which has no VFO or AM (Address Mark) pattern and therefore cannot set the read gate interval.

In addition, to set a number of loop gains, a corresponding number of charge pumps must be prepared, resulting in an increase in circuit scale.

A PLL circuit technique of maintaining stability of the PLL loop in a wide band or advancing the lock-up time by controlling the conversion gain of the VCO in the PLL loop in accordance with a desired frequency is disclosed in Japanese Unexamined Patent Publication No. 5-37370.

FIG. 3 is a block diagram of a PLL circuit according to the above third prior art. This conventional PLL circuit comprises a phase comparator 1401 for detecting the phase difference between a signal Fout/N divided by a first programmable frequency divider 1404 and a reference clock f output from a reference oscillator 1407 and outputting a phase error signal, a low-pass filter 1402 for smoothing the phase error signal, a VCO 1403 whose oscillation frequency changes depending on the output signal from the low-pass filter 1402, a second programmable frequency divider 1408 for dividing the output frequency from the VCO 1403, and the first programmable frequency divider 1404 for frequency-dividing the output signal from the second programmable frequency divider 1408.

The operation of the PLL circuit will be described next.

An output signal Fout from the second programmable frequency divider 1408, which is obtained by frequency-dividing the output signal from the VCO 1403 by M is frequency-divided by N by the first programmable frequency divider 1404 and then compared with the reference clock f by the phase comparator 1401. The PLL loop operates such that the phase difference between the reference clock f and the signal Fout/N becomes zero. For this reason, the relationship Fout=N·f holds.

A loop gain G of the PLL circuit is given by G=Kd·Fo·Ko/(MN) where Kd is the conversion gain of the phase comparator 1401, Fo is the conversion gain of the low-pass filter 1402, Ko is the conversion gain of the VCO, and N and M are the frequency division ratios of the first and second programmable frequency dividers 1404 and 1408, respectively.

In this prior art, in the control using the constant values M and N, the conversion gain of a first voltage-controlled oscillation circuit 1409 can be controlled by sending a control signal to the first voltage-controlled oscillation circuit 1409. Since the loop gain can be set at a desired value in accordance with the output frequency, the operation can be stabilized in a wide band.

This PLL circuit can be effectively used to obtain the output signal Fout N times larger than the reference signal f. However, the PLL circuit is not suitable for the purpose of self-clocking of extracting a clock from the recorded digital data itself. Especially, when recorded data has change points at irregular time intervals, the clock cannot be extracted.

More specifically, as the timing signal for reading data, the signal to be compared (reference signal f) input to the phase comparator 1401 is used, and no frequency divider can be arranged on the output side of the reference signal f. That is, the frequency division ratio cannot be determined using a circuit arrangement not associated with the output frequency.

Additionally, in use of a predetermined reference signal, when the frequency division ratio of the programmable frequency divider becomes high, the oscillation frequency of the VCO 1403 rises accordingly. Since Ko/(MN) in the loop gain G=Kd·Fo·Ko/(MN) does not change, the loop gain of the PLL circuit as a whole does not change.

Furthermore, addition of programmable frequency dividers undesirably increases the circuit scale. To finely set the frequency division ratio, the frequency division ratio increases, and accordingly, the oscillation frequency of the VCO 1403 must rise. In this case, the VCO is difficult to design, and various problems are posed, i.e., the current consumption of the VCO 1403 increases, or the oscillation output enters the circuit as noise.

A PLL circuit having an improved resistance to noise in the phase circuit and a short pull-in time is disclosed in Japanese Unexamined Patent Publication No. 7-302072. This PLL circuit has a lock-out detection means and uses a gate means for passing a reproduction signal only within an interval including the input synchronization signal detection edge timing.

In this PLL circuit, the capture range is determined by the edge timing interval. When the window width of the edge timing interval is within the range of N% before and after the edge, the capture range is maximized at N%, so the capture range cannot be increased.

For the PLL circuit disclosed in Japanese Unexamined Patent Publication No. 4-162263, the read gate signal must be generated by the controller outside the PLL circuit. For this reason, this PLL circuit cannot extract a clock from a reproduction signal in a format which cannot set the read gate interval.

In addition, to set a number of gains, a corresponding number of charge pumps must be prepared, resulting in an increase in circuit scale.

The PLL circuit disclosed in Japanese Unexamined Patent Publication No. 5-37370 can hardly be used for the purpose of self-clocking of extracting a clock from the recorded digital data itself. Especially, when recorded data change points at irregular time intervals, the clock cannot be extracted.

Additionally, in use of a predetermined reference signal, when the frequency division ratio of the programmable frequency divider becomes high, the oscillation frequency of the VCO 1403 rises accordingly. Since Ko/(MN) in the loop gain G=Kd·Fo·Ko/(MN) does not change, the loop gain of the PLL circuit as a whole cannot be changed.

Furthermore, addition of programmable frequency dividers undesirably increases the circuit scale. To finely set the frequency division ratio, the frequency division radio increases, and accordingly, the oscillation frequency of the VCO 1403 must rise. In this case, the VCO is difficult to design, and various problems are posed, i.e., the current consumption of the VCO 1403 increases, or the oscillation output enters the circuit as noise.

The PLL circuit disclosed in Japanese Unexamined Patent Publication No. 7-302072 has an arrangement in which an edge timing interval is inserted, and the reproduction signal passes only in this interval. Since this arrangement cannot follow a signal having jitter larger than the edge interval, the recorded signal cannot be read. For this reason, considerable limitations are imposed on the capture range or the conversion gain of the phase comparator in terms of system configuration.

SUMMARY OF THE INVENTION

The present invention has been made in consideration of the above situation in the prior arts, and has as its object to provide a PLL circuit resistant to noise, which adjusts the loop gain even for a signal recorded in a format without PLL pull-in interval, advances the pull-in time by increasing the loop gain when the PLL circuit does not lock, and decreases the loop gain once the PLL circuit is locked.

It is the second object of the present invention to provide a PLL circuit which need not set a read gate interval using a controller or the like.

It is the third object of the present invention to provide a PLL circuit capable of setting several loop gains using a few circuit elements.

It is the fourth object of the present invention to provide a PLL circuit which has a wide capture range and does not raise the maximum frequency of a VCO in extracting a clock from a digitally recorded signal.

In order to achieve the above objects, according to the main aspect of the present invention, there is provided a PLL circuit having a phase comparator for detecting a phase difference between a reference signal having a predetermined frequency or a reproduction signal having signal change points at irregular time intervals and a signal to be compared and outputting a phase error signal, comprising mask means for performing one of control of transmitting at least part or all of the phase error signal and control of blocking at least part or all of the phase error signal in accordance with the reference signal or the reproduction signal, an output different from the phase error signal from the phase comparator, and the signal to be compared, a signal obtained by delaying the reference signal or the reproduction signal by an arbitrary time, or a signal obtained by frequency-dividing the phase error signal.

According to another aspect of the present invention, the phase error signal is blocked at a width of (Tmin−0.5·T) to (Tmin−1.5·T).

As is apparent from the above aspects, the PLL circuit of the present invention, the mask signal for masking the phase error signal output from the phase comparator is generated on the basis of the reference signal (reproduction signal) and the signal to be compared, which are input to the phase comparator. Since this PLL circuit does not change the loop gain by dividing the signal to be compared using a frequency divider, the loop gain can be changed independently of the format or scheme of the input signal.

Therefore, this PLL circuit can be applied even to an input signal having no read gate interval or PLL pull-in interval.

Since the loop gain is determined on the basis of the pulse width or pulse interval of the mask signal for masking the phase error signal output from the phase comparator, the loop gain can be set at an arbitrary value and timing.

Since the circuit for determining the loop gain is simple, the number of circuit elements can be small.

Since the loop gain is not changed by dividing the signal to be compared using a frequency divider, the oscillation frequency of the VCO can be the same as that of the reproduction signal or the reference signal as the input signal to the phase comparator. As a result, the oscillation frequency of the VCO need not be raised.

During a period except the mask period for masking the phase error signal output from the phase comparator, the phase error signal is the same as in the operation of the conventional PLL circuit. Since the method of the present invention using the mask signal does not influence the phase comparison range, the capture range can be widened.

The above and many other object, features and advantages of the present invention will become manifest to those skilled in the art upon making reference to the following detailed description and accompanying drawings, in which preferred embodiments incorporating the principles of the present invention are shown by way of illustrative examples.

DETAILED DESCRIPTION OF THE PREFERRED EMBODIMENTS

Several preferred embodiments of the present invention will be described below in detail with reference to the accompanying drawings.

Figure 4:
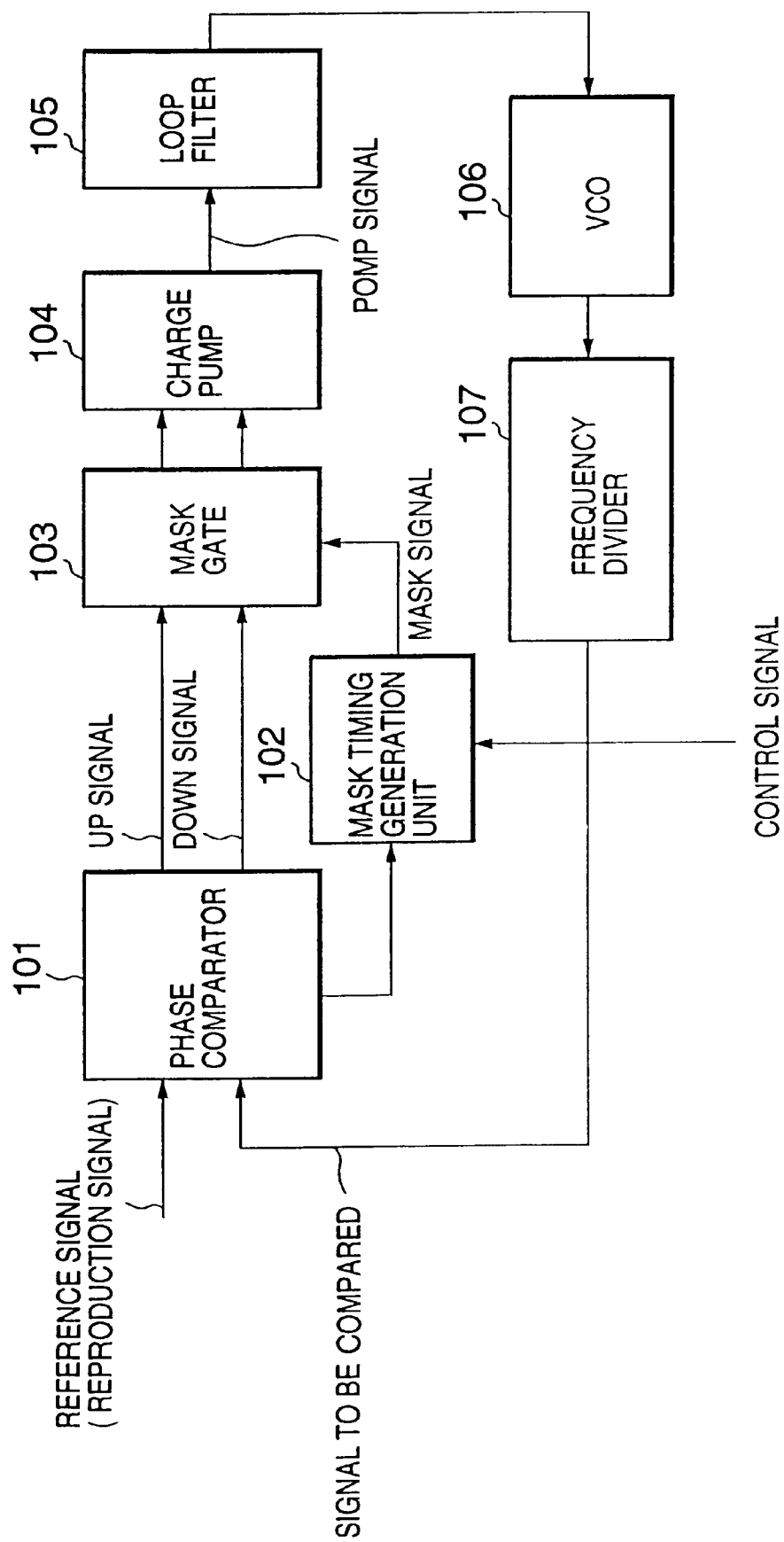
FIG. 4 is a block diagram schematically showing the overall arrangement of a PLL circuit according to the first embodiment of the present invention.

FIG. 4 is a block diagram showing a PLL circuit according to an embodiment of the present invention. In FIG. 4, a phase comparator 101 generally has two input terminals and outputs an UP signal and a DOWN signal as phase error signals corresponding to the difference between a reference signal (reproduction signal) and a signal to be compared, which are input to the input terminals. The PLL loop operates such that the phase error signals become zero. Therefore, when the PLL circuit is locked, the change points of the reference signal and the signal to be compared match each other.

A mask timing generation unit 102 generates a MASK signal on the basis of the phase error signals obtained by the phase comparator 101 or the leading/trailing edge signal of a pulse signal and an externally supplied control signal and outputs the MASK signal to a mask gate 103.

The mask gate 103 is controlled by the MASK signal generated by the mask timing generation unit 102 to select whether the phase error signals output from the phase comparator 101 are to be masked or passed.

A charge pump 104 outputs the phase error signals as the outputs from the phase comparator 101, which are allowed to pass through the mask gate 103, i.e., the UP signal and the DOWN signal as a desired current, i.e., a POMP signal.

A loop filter 105 smoothes the current output from the charge pump 104 and outputs it as a voltage or a current. As the loop filter 105, a low-pass filter using a resistor and a capacitor or a low-pass filter using an operational amplifier is used.

A VCO 106 is an oscillator whose oscillation frequency changes depending on the output voltage or output current from the loop filter 105. A frequency divider 107 divides the output frequency from the VCO 106 into a desired frequency.

The operation of the PLL circuit of this embodiment will be described next with reference to the block diagram of FIG. 4 and the timing chart of FIG. 5.

Figure 5:
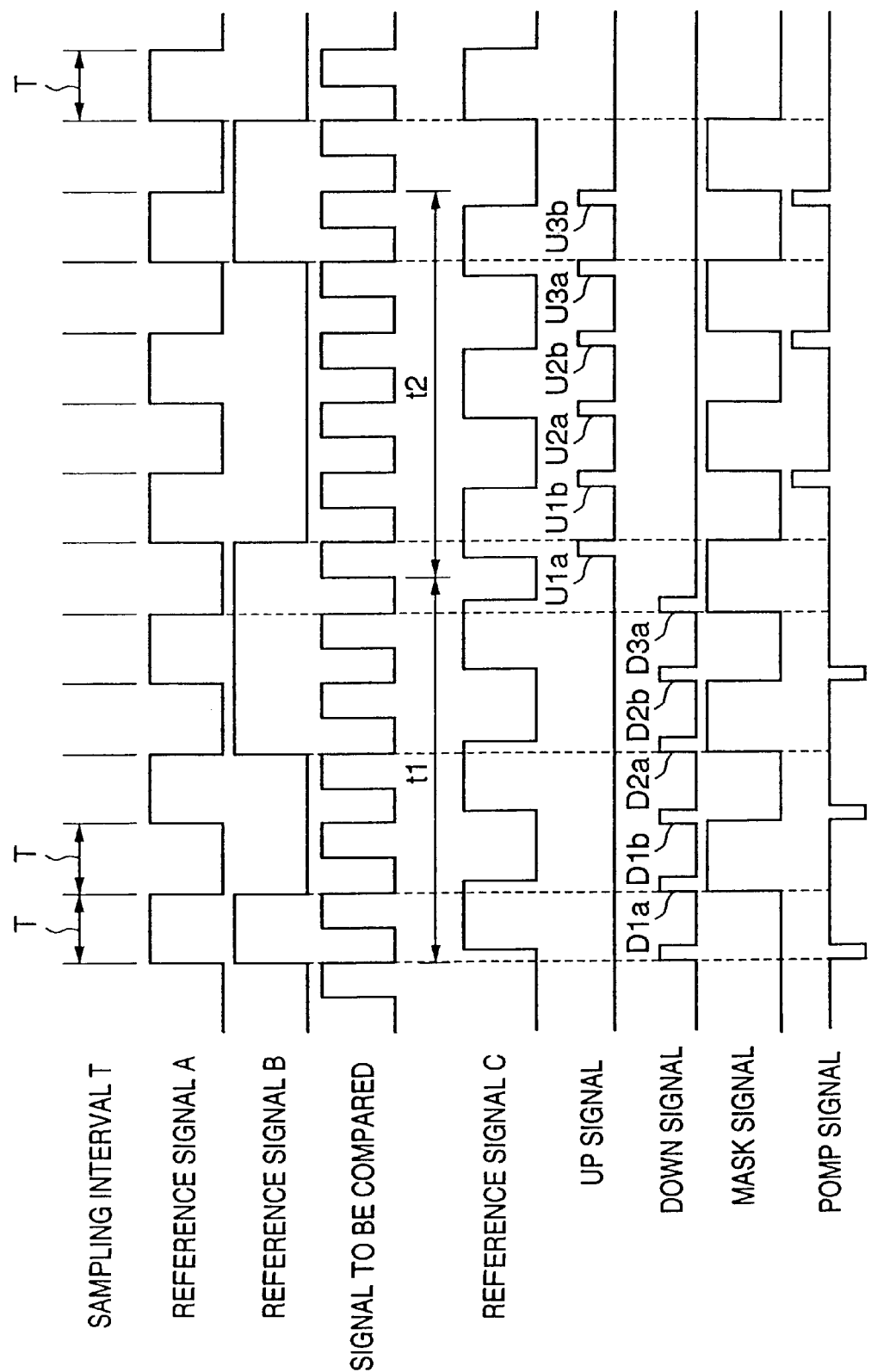
FIG. 5 is a timing chart for explaining the operation of the PLL circuit shown in FIG. 4.

As shown in FIG. 5, reference signals (reproduction signals) input to the phase comparator 101 in FIG. 4 can be roughly classified into a reference signal A and a reference signal B. The reference signal A has change points at a predetermined interval. For the reference signal B, with reference to a sampling interval T as the time interval from the rise to the fall of the signal or from the fall to the rise of the signal, the minimum time interval from the rise to the fall of the pulse signal or from the fall to the rise of the pulse signal is defined as a minimum inversion interval Tmin, and the maximum time interval from the rise to the fall of the pulse signal or from the fall to the rise of the pulse signal is defined as a maximum inversion interval Tmax. The change points of the reference signal B are generated under a predetermined condition at irregular intervals ranging from the minimum inversion interval Tmin to the maximum inversion interval Tmax.

A signal like the reference signal B having change points at irregular time intervals is obtained by converting a digital signal on the basis of a certain rule. This conversion is generally called modulation. There are various modulation schema such as NRZ (Non Return Zero), PE (Phase Encoding), MFM (Modified Frequency Modulation), and EFM (Eight to Fourteen Modulation). To the PLL circuit of this embodiment, any modulation capable of self-clocking can be used except modulation schema such as NRZ which cannot extract a clock.

The sampling interval T in FIG. 5 represents the time width of a channel bit as the minimum data unit of digital data. A channel bit clock for reading a channel bit is generated by the PLL circuit of this embodiment. A channel bit clock (to be referred to as a bit clock hereinafter) having the sampling interval T is shown as a signal to be compared in FIGS. 4 and 5.

As indicated by a reference signal C in FIG. 5, if a phase shift is generated between the reference signal and the signal to be compared (the phase lead/lag is defined as the lead/lag of the phase of the signal to be compared with respect to the reference signal), the phase comparator 101 shown in FIG. 4 detects the phase difference between the reference signal C and the signal to be compared and outputs the UP signal and the DOWN signal shown in FIG. 5.

The MASK signal generated by the mask timing generation unit 102 shown in FIG. 4 has a duty ratio of 50%, as shown in FIG. 5. Assume that the mask gate 103 shown in FIG. 4 masks the UP signal or the DOWN signal while the MASK signal is at high level and passes the UP signal or the DOWN signal while the MASK signal is at low level. In this case, the POMP signal shown in FIG. 5 is output from the charge pump 104.

More specifically, during a period t1, the fall of the signal to be compared has an advance with respect to the rise or fall of the reference signal C. For this reason, the phase comparator 101 outputs the DOWN signal to the charge pump 104 through the mask gate 103 to delay the phase of the signal to be compared.

On the other hand, during a period t2, the signal to be compared has a phase lag with respect to the reference signal C. Therefore, the phase comparator 101 outputs the UP signal to the charge pump 104 through the mask gate 103 to advance the phase of the signal to be compared.

However, UP signals U1$a$, U2$a$, and U3$a$ and DOWN signals D1$a$, D2$a$, and D3$a$ shown in FIG. 5, which are output during periods when the MASK signal is at high level, are masked by the mask gate 103 and not output to the charge pump 104.

On the other hand, UP signals U1$b$, U2$b$, and U3$b$ and DOWN signals D1$b$ and D2$b$, which are output in periods when the MASK signal is at low level, are output to the charge pump 104 through the mask gate 103.

As shown in FIG. 5, the POMP signal as the output signal from the charge pump 104 has a pulse signal count ½ that of a signal not masked by the mask gate 103. For this reason, the loop gain of the PLL circuit of this embodiment is ½ that when the mask gate 103 passes all phase error signals.

As a scheme of modulating the reference signal in this embodiment shown in FIG. 4, EFM modulation used in a compact disk (CD) or the like will be described in detail.

EFM modulation is capable of self-clocking. However, the change points corresponding to the rise or fall of the signal recorded on a CD or the like do not occur at regular time intervals. In EFM modulation, digital data called a recording symbol of 8 bits is converted into a pattern consisting of 14 channel bits. In this EFM modulation, considering facilitation of extraction of bit synchronization information, high-density recording, and DC components of signals, the minimum inversion interval Tmin is defined as 3T, and the maximum inversion interval Tmax is defined as 11T on the basis of the sampling interval T.

Figure 6:
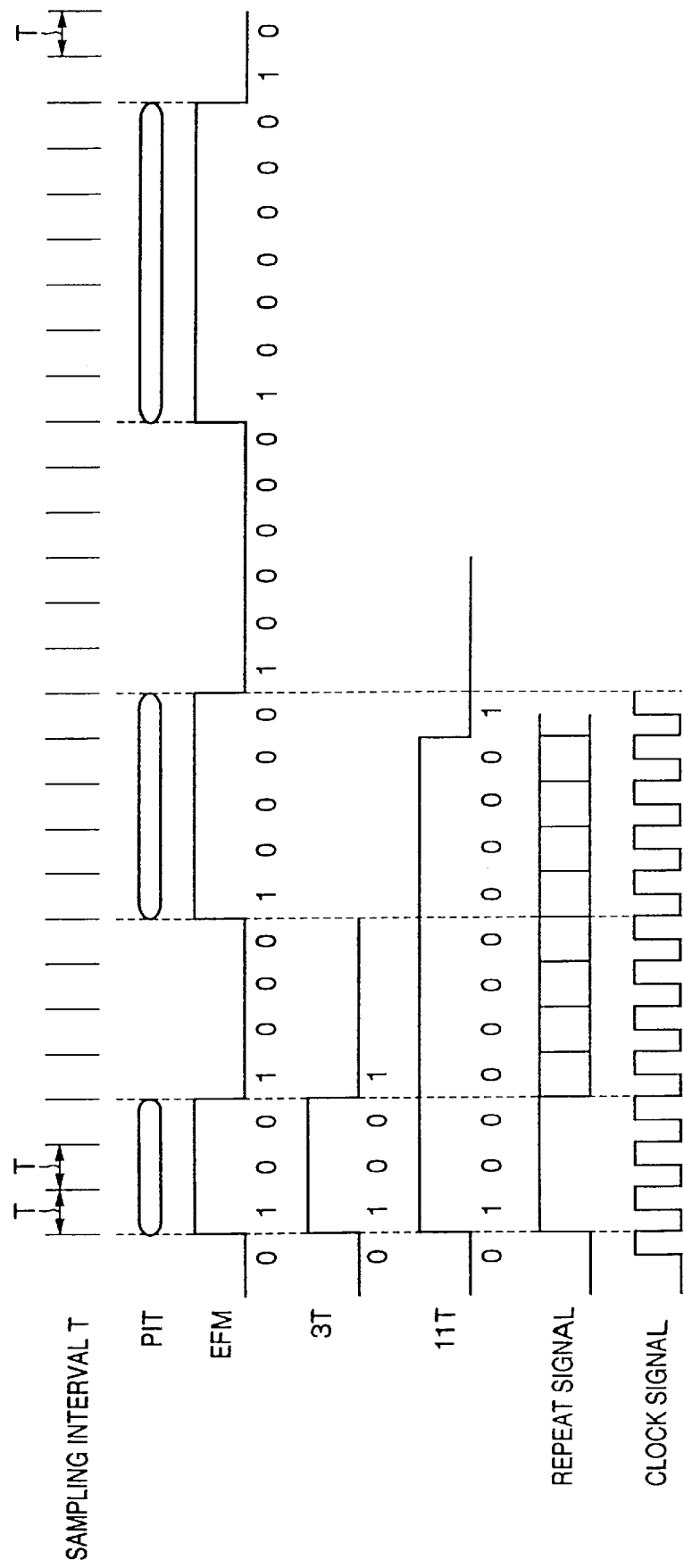
FIG. 6 shows a timing chart for explaining EFM modulation and a view showing pits.

FIG. 6 shows a timing chart in EFM modulation and a view showing the positions of holes called pits recorded on the CD surface in correspondence with an EFM signal. In EFM modulation, digital data recorded as pits is read using a laser beam (not shown) from a pickup and converted into binary signals of levels "0" and "1". An EFM signal has data intervals from 3T to 11T as defined. To extract a clock from the data read from the pits, the leading and trailing edges of the signal are used.

For a normally recorded signal, these edges are present at intervals of 3T to 11T. A continuous pulse string is generated using the frequency spectral component of the repeat signal of these continuous pulses.

The circuits of the phase comparator 101 and the mask timing generation unit 102 shown in FIG. 4 will be described next in detail with reference to FIG. 7 which shows a gate-level circuit diagram of the phase comparator 101 and a mask timing generation unit 102A.

Figure 7:
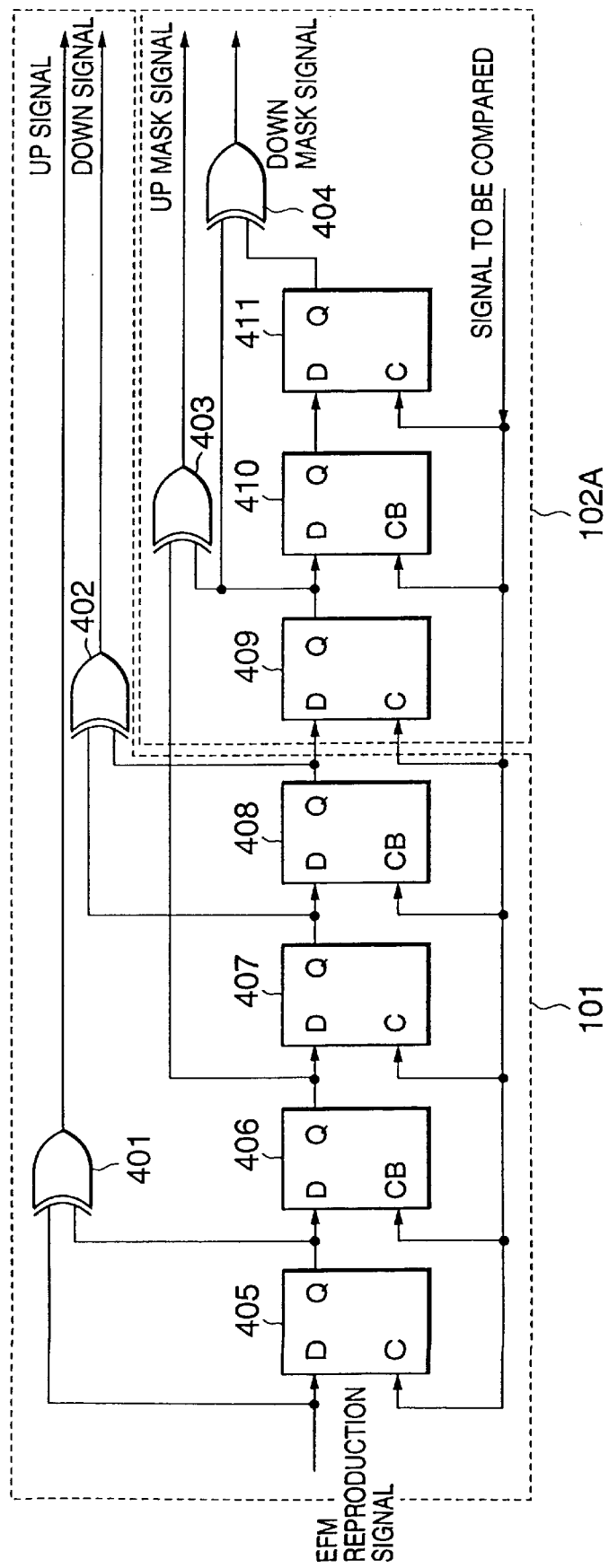
FIG. 7 is a circuit diagram showing a phase comparator and a mask timing generation unit according to the first embodiment of the present invention.

In FIG. 7, flip-flops 405 to 411 constitute seven shift registers. An EFM signal is input to a data input terminal D of the first flip-flop 405. A signal to be compared is input to clock input terminals C and inverted clock input terminals CB. For edge delay for generating a MASK signal, the signal to be compared is input to the clock input terminals C of the flip-flops 405, 407, 409, and 411 and the inverted clock input terminals CB of the flip-flops 406, 408, and 410.

An exclusive OR gate 401 receives the EFM reproduction signal and the Q output from the flip-flop 405 and outputs an UP signal. An exclusive OR gate 402 receives the Q outputs from the flip-flops 407 and 408 and outputs a DOWN signal.

An exclusive OR gate 403 receives the Q outputs from the flip-flops 406 and 409 and outputs an UP MASK signal. An exclusive OR gate 404 receives the Q outputs from the flip-flops 409 and 411 and outputs a DOWN MASK signal. The UP MASK signal and the DOWN MASK signal are MASK signals for the UP signal and the DOWN signal which independently control transmission and masking of the UP signal and the DOWN signal.

The operations of the phase comparator 101 and the mask timing generation unit 102 shown in FIG. 7 will be described next in detail with reference to the block diagram of FIG. 7 and the timing chart of FIG. 8.

The EFM reproduction signal changes at intervals ranging from 3T to 11T based on the sampling interval T and is input to the data input terminal D of the flip-flop 405. The flip-flops 405 to 411 operate at the rise of the clock input C. The Q outputs from the flip-flops 405 to 411 have waveforms as shown in FIG. 8.

Figure 8:
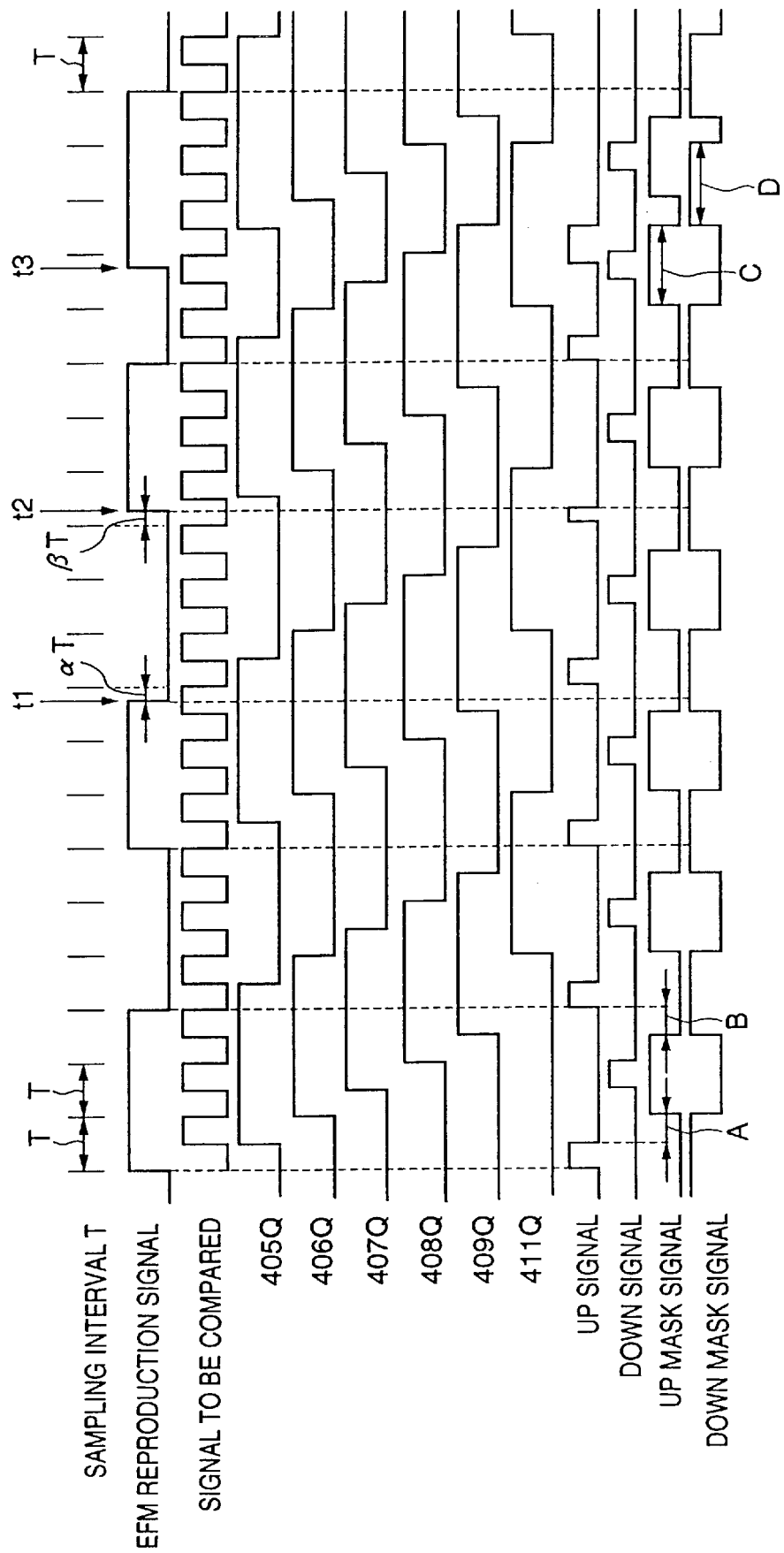
FIG. 8 is a timing chart for explaining the operations of the phase comparator and the mask timing generation unit shown in FIG. 7.

Since the exclusive OR gate 401 receives the EFM reproduction signal and the Q output from the flip-flop 405, the UP signal as the output from the exclusive OR gate 401 has a waveform as shown in FIG. 8. More specifically, the UP signal in the locked state is output from the exclusive OR gate 401 at a pulse width T/2 from a change point of the EFM reproduction signal.

At time t1, the fall of the EFM reproduction signal advances with respect to the fall of the signal to be compared. In this case, the UP signal is output at a pulse width longer by the time width of the phase lead of the EFM reproduction signal. Assume that the EFM reproduction signal advances with respect to the signal to be compared by αT. In this case, the pulse width of the UP signal is represented by (½+α)·T, i.e., an increase amount of pulse width due to the phase lead of the EFM reproduction signal is added to the width of the UP signal in the locked state.

Conversely, at time t2, the rise of the EFM reproduction signal delays with respect to the fall of the signal to be compared. In this case, the UP signal is output at a pulse width shorter by the time width of the phase lag of the EFM reproduction signal. Assume that the EFM reproduction signal delays with respect to the signal to be compared by βT. In this case, the pulse width of the UP signal is represented by (½−β)·T, i.e., a decrease amount of pulse width due to the phase lag of the EFM reproduction signal is subtracted from the width of the UP signal in the locked state.

As is apparent from FIG. 8, the DOWN signal is output at a pulse width of T/2 with a time lag of 1T from the fall of the UP signal. The phase difference between the EFM reproduction signal and the signal to be compared (bit clock) does not influence the pulse width of the DOWN signal. That is, the pulse width of the DOWN signal is fixed at T/2 in the locked state and at time t1 or t2.

In the locked state, both the UP signal and the DOWN signal are input to the charge pump 104 at a pulse width of T/2 with equal pulse counts. The POMP signal as the output from the charge pump 104 is smoothed by the loop filter 105 shown in FIG. 4. Since the control voltage of the VCO 106 does not change, the signal to be compared (bit clock) as a frequency-divided signal from the VCO 106 does not change either.

At time t1 when the EFM reproduction signal has a phase lead of αT with respect to the signal to be compared (bit clock), the pulse width of the UP signal is (½+α)·T, and the pulse width of the DOWN signal is T/2, i.e., the pulse width of the UP signal is larger by αT. When the POMP signal as the output from the charge pump 104 is smoothed by the loop filter 105 shown in FIG. 4, the output voltage from the loop filter 105 rises due to αT, and the control voltage of the VCO 106 also rises. For this reason, the oscillation frequency of the VCO 106 and the frequency of the signal to be compared (bit clock) as a frequency-divided signal also rise.

That is, when the EFM reproduction signal has a phase lead with respect to the signal to be compared (bit clock), the PLL circuit operates to make the phase difference zero by raising the frequency of the signal to be compared (bit clock).

At time t2 when the EFM reproduction signal has a phase lag of βT with respect to the signal to be compared (bit clock), the pulse width of the UP signal is (½−β)·T, and the pulse width of the DOWN signal is T/2, i.e., the pulse width of the DOWN signal is larger by βT. When the POMP signal as the output from the charge pump 104 is smoothed by the loop filter 105 shown in FIG. 4, the output voltage from the loop filter 105 lowers due to βT, and the control voltage of the VCO 106 also lowers. For this reason, the oscillation frequency of the VCO 106 and the frequency of the signal to be compared (bit clock) as a frequency-divided signal also lower.

That is, when the EFM reproduction signal has a phase lag with respect to the signal to be compared (bit clock), the PLL circuit operates to make the phase difference zero by lowering the frequency of the signal to be compared (bit clock).

In EFM modulation, the minimum inversion interval is defined as 3T, as described above. Therefore, when a signal is reproduced from a change point at an interval shorter than 3T, the reproduction signal is likely to be electrical noise or a signal defect.

With a circuit arrangement capable of preventing the PLL circuit from responding to change points at intervals shorter than 3T, a stable signal to be compared (bit clock) can be obtained. When UP signals and DOWN signals generated at the change points at intervals shorter than 3T are masked not to be output to the charge pump 104, the oscillation frequency of the VCO 106 does not change, so an erroneous operation due to noise or signal defect can be prevented.

In this embodiment, the UP signal and the DOWN signal are independently output from the phase comparator 101 at a certain time interval. Therefore, the MASK signals for the UP signal and the DOWN signal must also be independently generated.

Considering the fact that after the UP signal and the DOWN signal are output from the phase comparator 101, a margin due to variations in characteristics of the MOS transistor is ensured, as indicated by A in FIG. 8, and the UP signal varies at a width B in FIG. 8, the UP signal and the DOWN signal are preferably masked by Tmask represented by equation (1):

$$Tmask = 3T - 0.5T - 0.5T - 0.5T = 1.5T \quad (1)$$

where the first term represents the minimum inversion interval Tmin; the second term, the width of the UP signal or DOWN signal; the third term, the margin of the portion A shown in FIG. 8; and the fourth term, the margin of the portion B shown in FIG. 8.

As described above, the control signal output from the mask timing generation unit 102 to the mask gate 103 shown in FIG. 4 in correspondence with the UP signal is the UP MASK signal, and the control signal output from the mask timing generation unit 102 to the mask gate 103 shown in FIG. 4 in correspondence with the DOWN signal is the DOWN MASK signal. The mask gate 103 shown in FIG. 4 masks the UP signal or the DOWN signal when the UP MASK signal or the DOWN MASK signal is at high level and passes the UP signal or the DOWN signal when the UP MASK signal or the DOWN MASK signal is at low level.

In FIG. 8, t3 represents a state wherein a change point generated at an interval shorter than 3T is contained in the EFM reproduction signal due to noise or the like. In this case as well, the UP signal generated at time t3 is not output to the charge pump shown in FIG. 4 because it is masked by the UP MASK signal indicated by C. Similarly, the DOWN signal is masked by the DOWN MASK signal indicated by D in FIG. 8.

Therefore, even when noise is generated at an interval shorter than 3T, the PLL circuit can be kept stable without changing the loop gain of the PLL circuit.

When the pulse width of the MASK signal is extended to mask a signal having a width smaller than 4T, the PLL circuit does not respond to change points generated at intervals shorter than 3T in the EFM reproduction signal.

Generally, the ratio of changes at a time interval of 3T is 35% to 40% when the ratio of all change points up to the time interval of 11T is 100%. If this ratio is adequate, the phase comparison count decreases by 35% to 40%, and the loop gain G of the PLL circuit as a whole can be lowered by 35% to 40%.

When the LOCK signal representing whether the PLL circuit is locked is used as the control signal for the mask timing generation unit 102 shown in FIG. 4, and the POMP signal is generated only when the PLL circuit is locked, the response speed can be increased while keeping a high loop gain in the pull-in state of the PLL circuit, so quick pull-in can be performed. Upon completing pull-in, an erroneous operation due to electrical noise or signal defect can be prevented by the MASK signal, so a stable circuit operation can be realized.

As described above, when the LOCK signal is used as the control signal for the mask timing generation unit 102 shown in FIG. 4, a PLL circuit having different PLL loop gains for the locked and unlocked states can be realized.

The mask timing generation unit 102 can also be controlled using a control signal from a microcomputer. More specifically, the pulse width of the MASK signal (UP MASK signal or DOWN MASK signal) generated by the mask timing generation unit 102 is controlled within the range of 3T to 11T using a program or selected within the range of 3T to 11T. With this arrangement, the loop gain of the PLL circuit can be set at an arbitrary timing by the microcomputer.

The reference signal is not limited to the EFM reproduction signal. Even when a signal of another modulation scheme, or a reproduction signal having change points at a predetermined time interval is used, the loop gain of the PLL circuit can be arbitrarily set by controlling the pulse width of the MASK signal.

As the control signal for the mask timing generation unit 102, both a control signal from a microcomputer and the LOCK signal can be used.

The arrangement of the phase comparator and the output scheme of the UP signal and the DOWN signal are not limited to those described above in this embodiment. As far as the circuit arrangement can control the mask gate by a MASK signal output from a mask timing generation unit, and the phase error signals from the phase comparator are input to the charge pump through the mask gate, the loop gain of the PLL circuit can be changed, or a PLL circuit for preventing an erroneous operation due to noise or signal defect while maintaining a predetermined loop gain can be easily constituted by applying the technical concept of the present invention.

The MASK signal may be output at a predetermined period or at an arbitrary pulse width when phase comparison is performed.

If the reference signal is a reproduction signal having change points at irregular intervals and a frequency twice or more higher than that of the signal to be compared, a frequency comparison circuit is preferably arranged to compare the frequency of the reproduction signal with that of the signal to be compared, thereby preventing the PLL circuit from erroneously locking.

Figure 9:
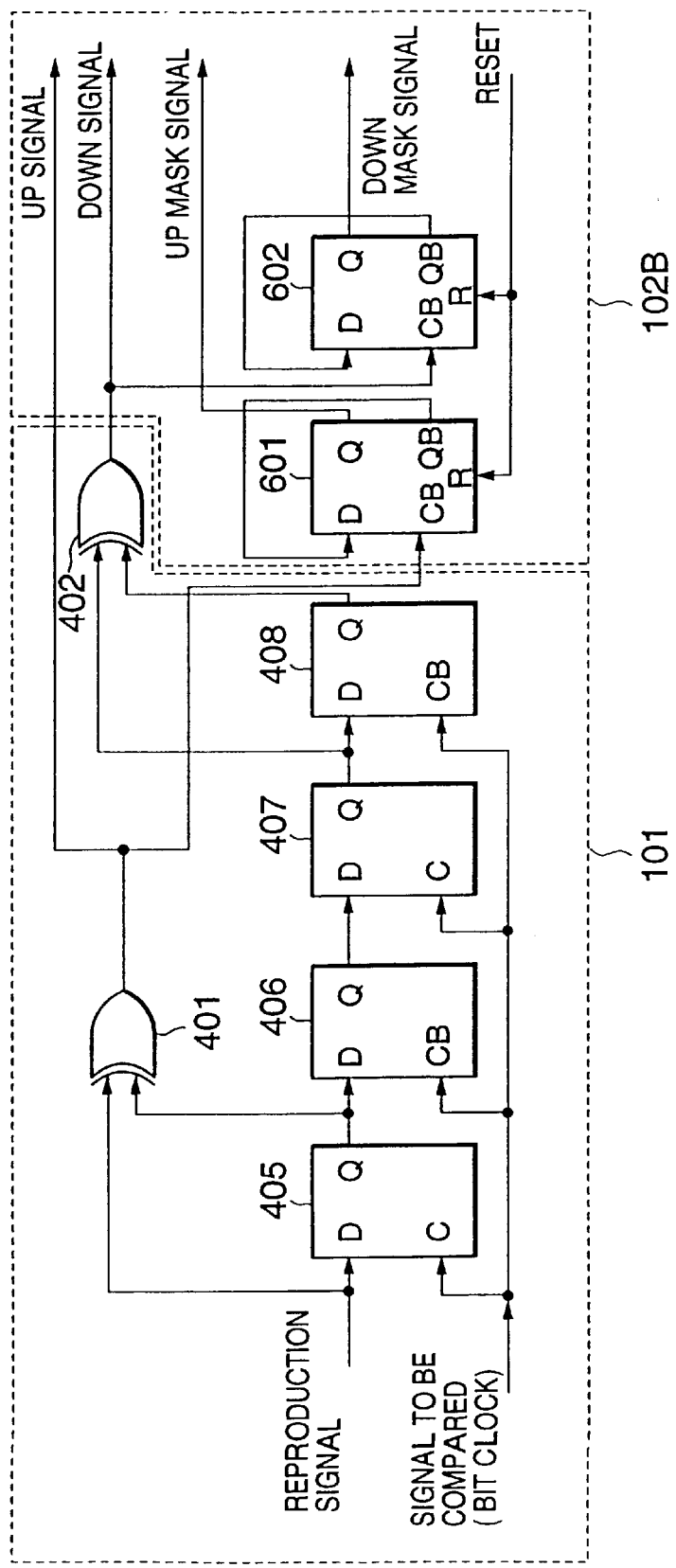
FIG. 9 is a circuit diagram showing a phase comparator and a mask timing generation unit according to the second embodiment of the present invention.

The second embodiment of the present invention will be described with reference to FIG. 9. In FIG. 9, reference numeral 101 denotes a gate-level circuit diagram showing the phase comparator 101 in FIG. 4, as in FIG. 7; and 102B, a gate-level circuit diagram of the mask timing generation unit 102 shown in FIG. 4. Flip-flops 405 to 408 constitute shift registers. A reproduction signal is input to a data input terminal D of the first flip-flop 405.

As in the phase comparator 101 shown in FIG. 7, an exclusive OR gate 401 generates an UP signal, and an exclusive OR gate 402 generates a DOWN signal.

A flip-flop 601 constituting the mask timing generation unit 102B is a toggle flip-flop for receiving the UP signal as an inverted clock. The flip-flop 601 generates an UP MASK signal as a MASK signal for the UP signal. Similarly, a flip-flop 602 receives the $D^6WN$ signal as an inverted clock and generates a DOWN MASK signal.

Figure 10:
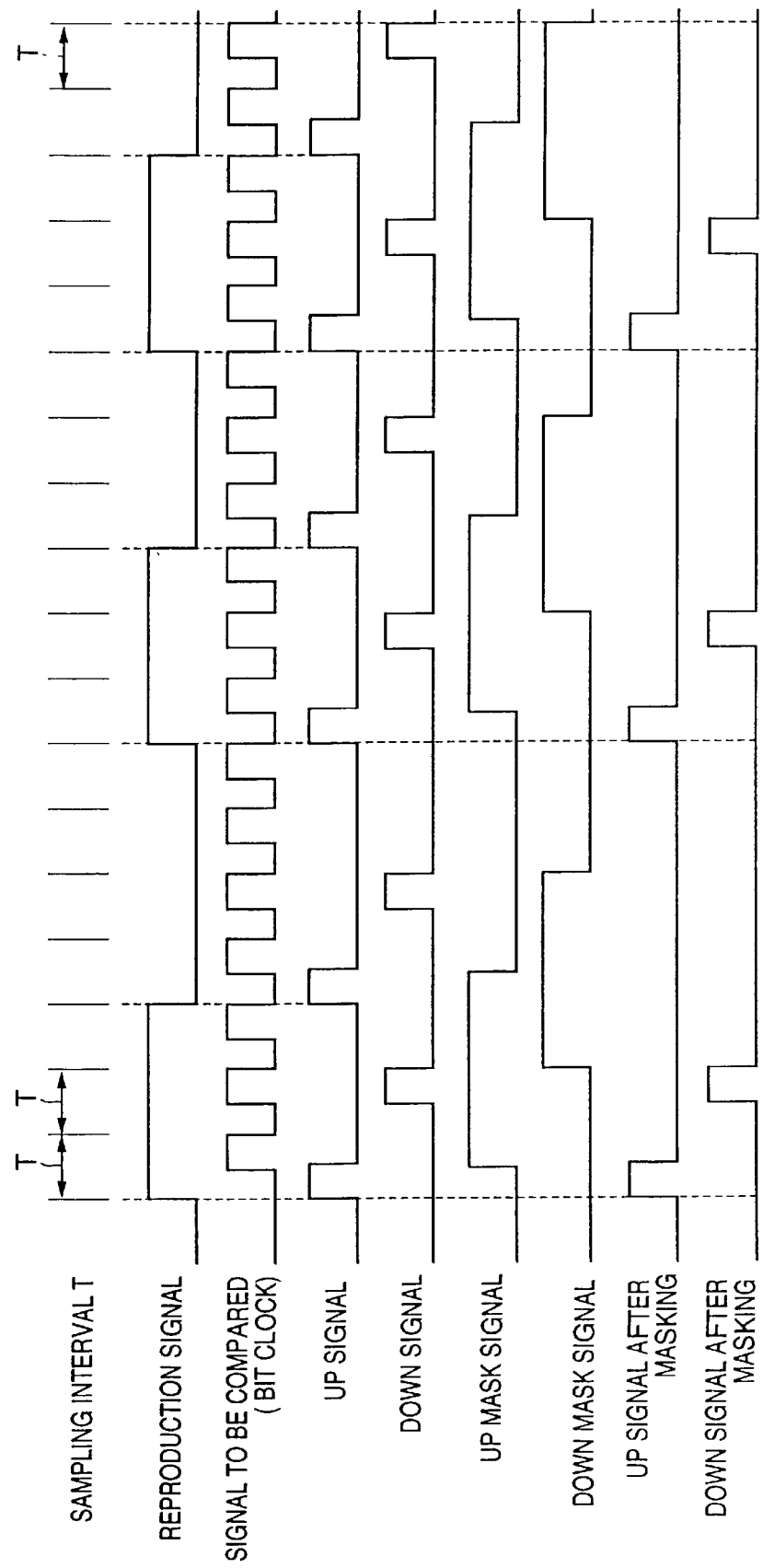
FIG. 10 is a timing chart for explaining the operations of the phase comparator and the mask timing generation unit shown in FIG. 9.

The operations of the phase comparator 101 and the mask timing generation unit 102B shown in FIG. 9 will be described next in detail with reference to the block diagram of FIG. 9 and the timing chart of FIG. 10.

The flip-flops 405 to 408 have the same circuit arrangement as that shown in FIG. 7, and a detailed description thereof will be omitted. Since the flip-flop 601 receives the UP signal from an inverted clock input terminal CB, the UP MASK signal repeatedly goes high and low every time the UP signal falls, as shown in FIG. 10.

The flip-flop 602 also outputs a signal which repeatedly goes high and low every time the DOWN signal falls. That is, the outputs from the flip-flops 601 and 602 have periods twice those of the UP signal and the DOWN signal, respectively. When these outputs are used as MASK signals, the duty ratio of the UP signal and the DOWN signal can be halved.

This also halves the loop gain of the PLL circuit. When a LOCK signal is used as a control signal, as in the first embodiment, and the MASK signal is generated after the PLL circuit is locked (when the LOCK signal represents the locked state at high level, a Reset signal shown in FIG. 9 is used), a PLL circuit which increases the response speed by increasing the loop gain in the pull-in state of the PLL circuit, and after the locked state, decreases the loop gain to ½ to attain a stable operation resistant to noise can be realized. Although the loop gain is limited to ½, the circuit can be constituted by a minimum number of devices.

In addition, when the toggle flip-flop constituting the mask timing generation unit 102B is replaced with the circuit arrangement of a frequency divider or a counter, and the generation ratio of the rise or fall of the MASK signal per unit time is changed to ½ to $\frac{1}{n}$ (n is a natural number), the loop gain of the PLL circuit can be arbitrarily set.

A PLL circuit according to the third embodiment of the present invention will be described next with reference to the block diagram of FIG. 11.

Figure 11:
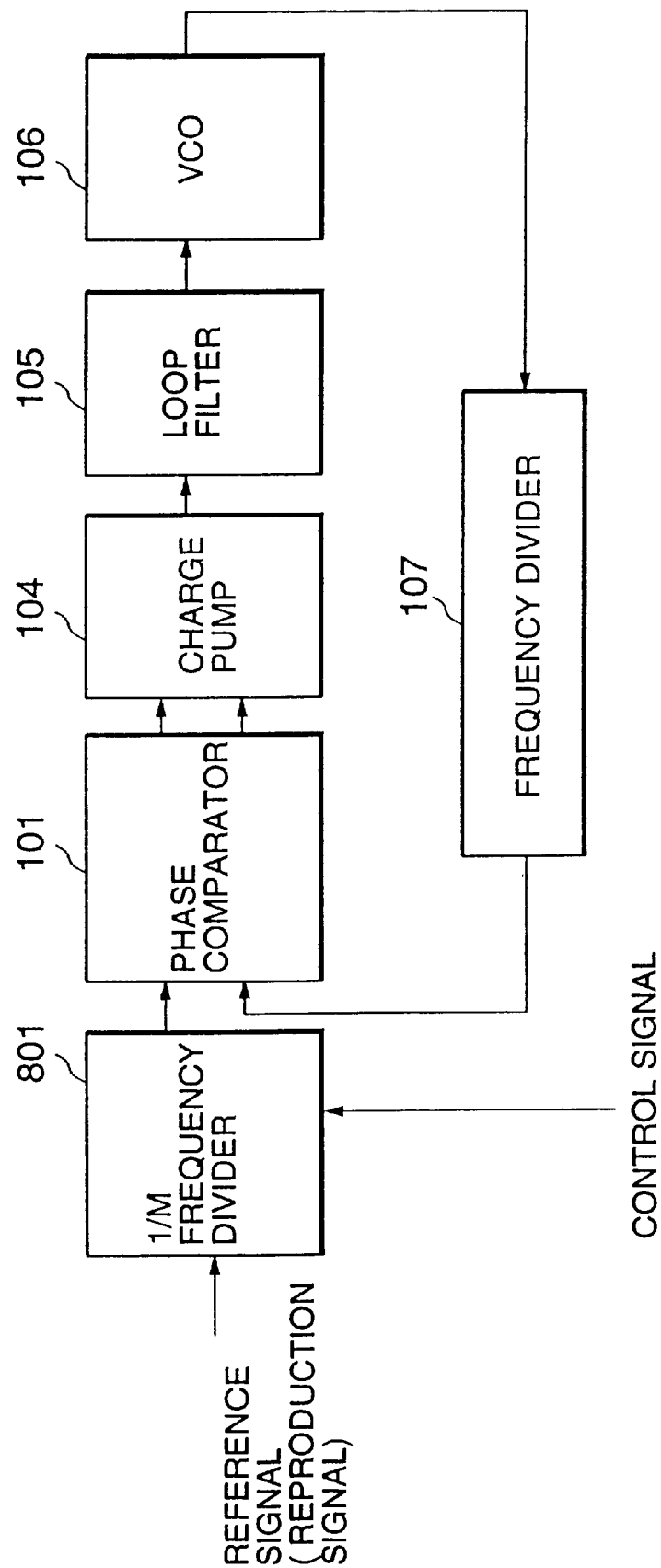
FIG. 11 is a block diagram schematically showing the overall arrangement of a PLL circuit according to the third embodiment of the present invention.

The PLL circuit shown in FIG. 11 does not use the mask timing generation unit 102 and the mask gate 103 constituting the PLL circuit shown in FIG. 4. Instead, a reference signal (reproduction signal) is input to a phase comparator 101 through a $\frac{1}{M}$ frequency divider 801. The $\frac{1}{M}$ frequency divider 801 is constituted by a general programmable frequency divider or counter to frequency-divide the reference signal (reproduction signal) as the input signal by M and output the signal. The frequency division ratio can be changed or the frequency division function can be turned on/off by a control signal.

Figure 12:
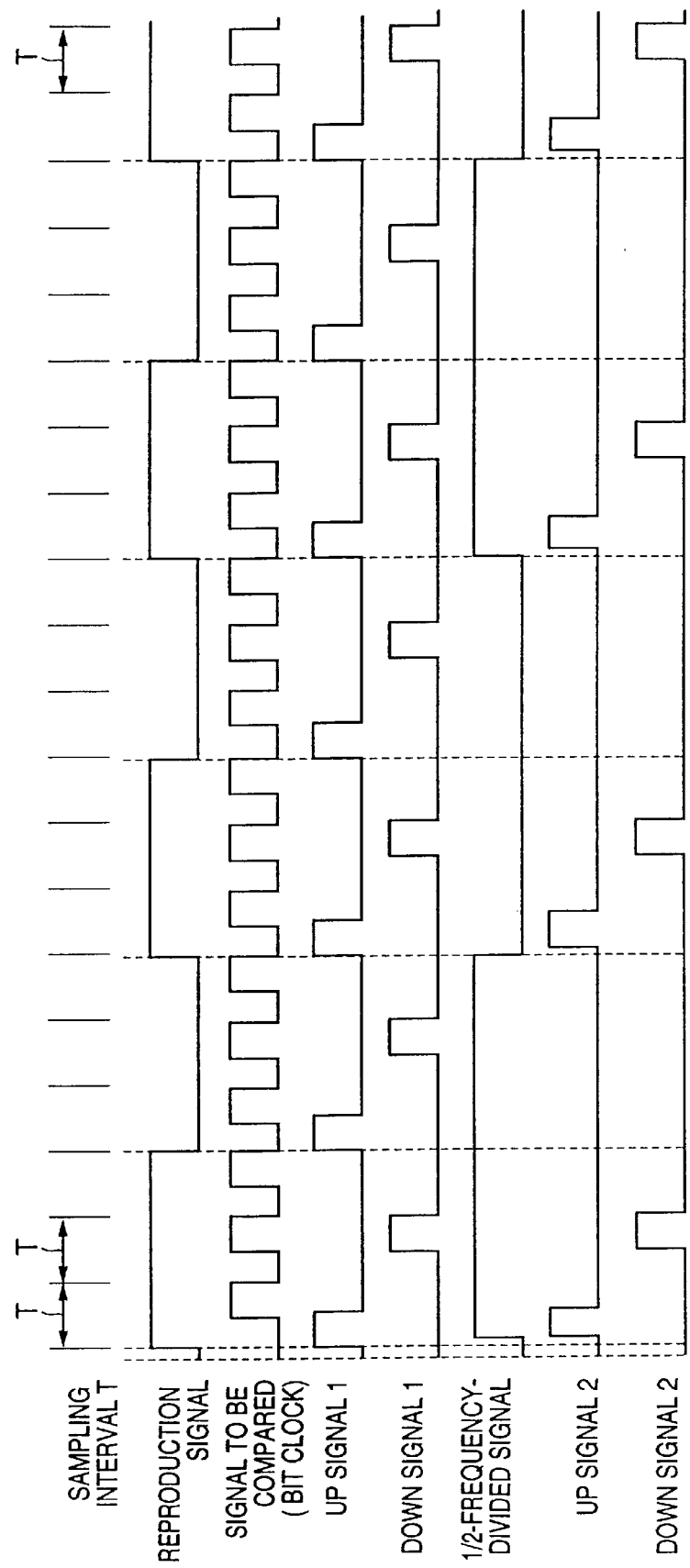
FIG. 12 is a timing chart for explaining the operation of the PLL circuit shown in FIG. 11.

The operation of the PLL circuit according to the third embodiment of the present invention will be described next with reference to the timing chart of FIG. 12. In FIG. 12, UP signal 1 and DOWN signal 1 are an UP signal and a DOWN signal output from the phase comparator 101 when the reference signal (reproduction signal) is input to the phase comparator 101 without intervening the $\frac{1}{M}$ frequency divider 801 shown in FIG. 11.

When the $\frac{1}{M}$ frequency divider 801 operates as a ½ frequency divider, the reference signal (reproduction signal) transmitted through the $\frac{1}{M}$ frequency divider 801 becomes a ½-frequency-divided reproduction signal shown in FIG. 12. The phase comparator 101 compares the phase of the frequency-divided signal with that of the signal to be compared (bit clock) and outputs UP signal 2 and DOWN signal 2 to a charge pump 104.

Since the duty ratio of UP signal 2 and DOWN signal 2 is ½ that of UP signal 1 and DOWN signal 1, the loop gain of the PLL circuit also decreases to ½. Therefore, when the 1/M frequency divider 801 is used, the loop gain of the PLL circuit can be decreased to 1/M without using the MASK signal, unlike the PLL circuit of the first embodiment.

A PLL circuit according to the fourth embodiment of the present invention will be described next with reference to the block diagram of FIG. 13.

Figure 1:
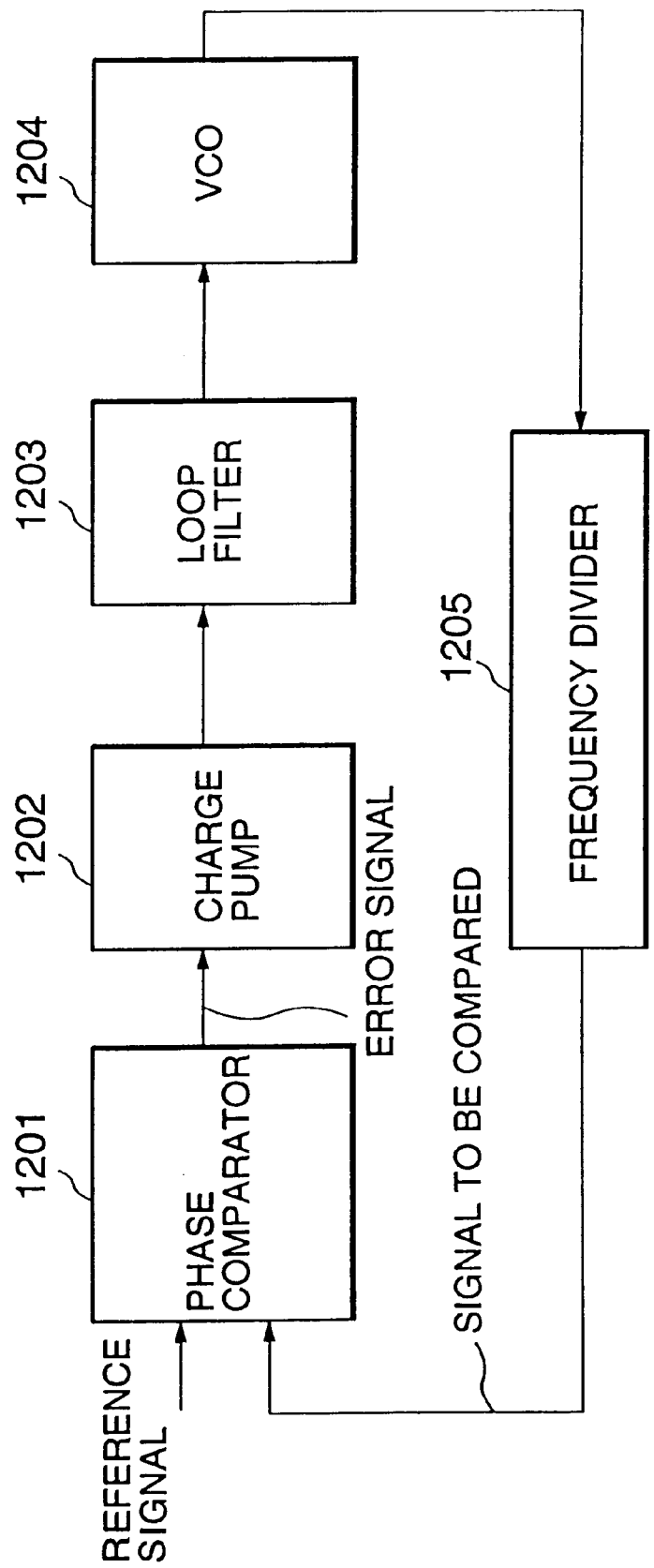
FIG. 1 is a block diagram schematically showing the overall arrangement of a PLL circuit according to the first prior art.
Figure 2:
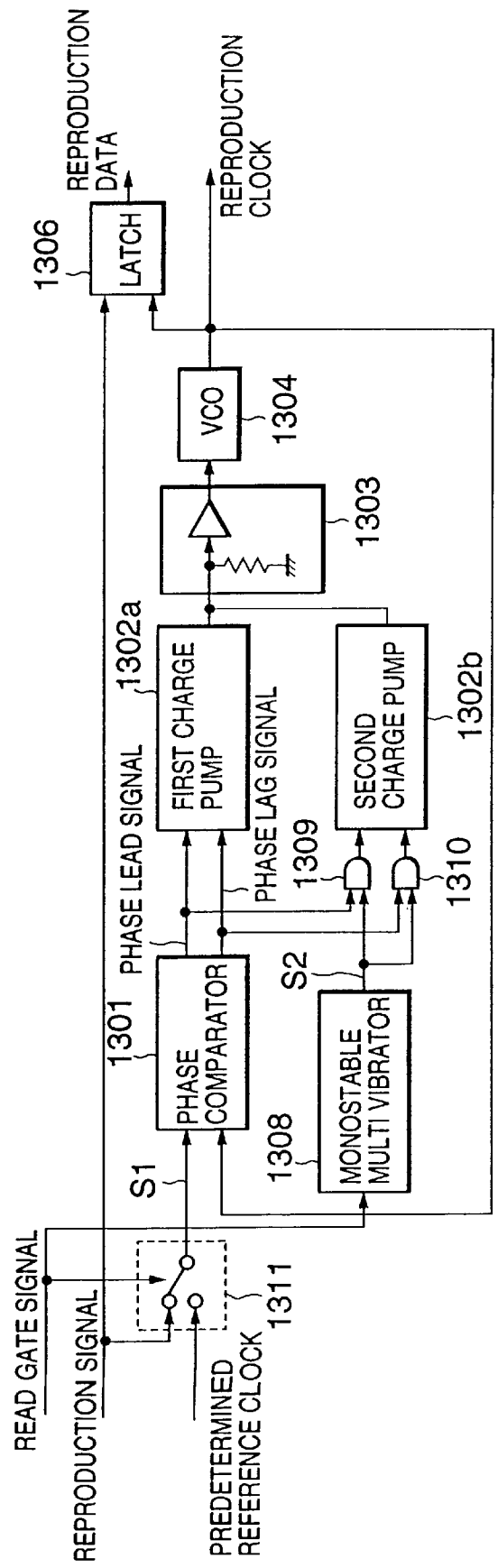
FIG. 2 is a block diagram schematically showing the overall arrangement of a PLL circuit according to the second prior art.
Figure 3:
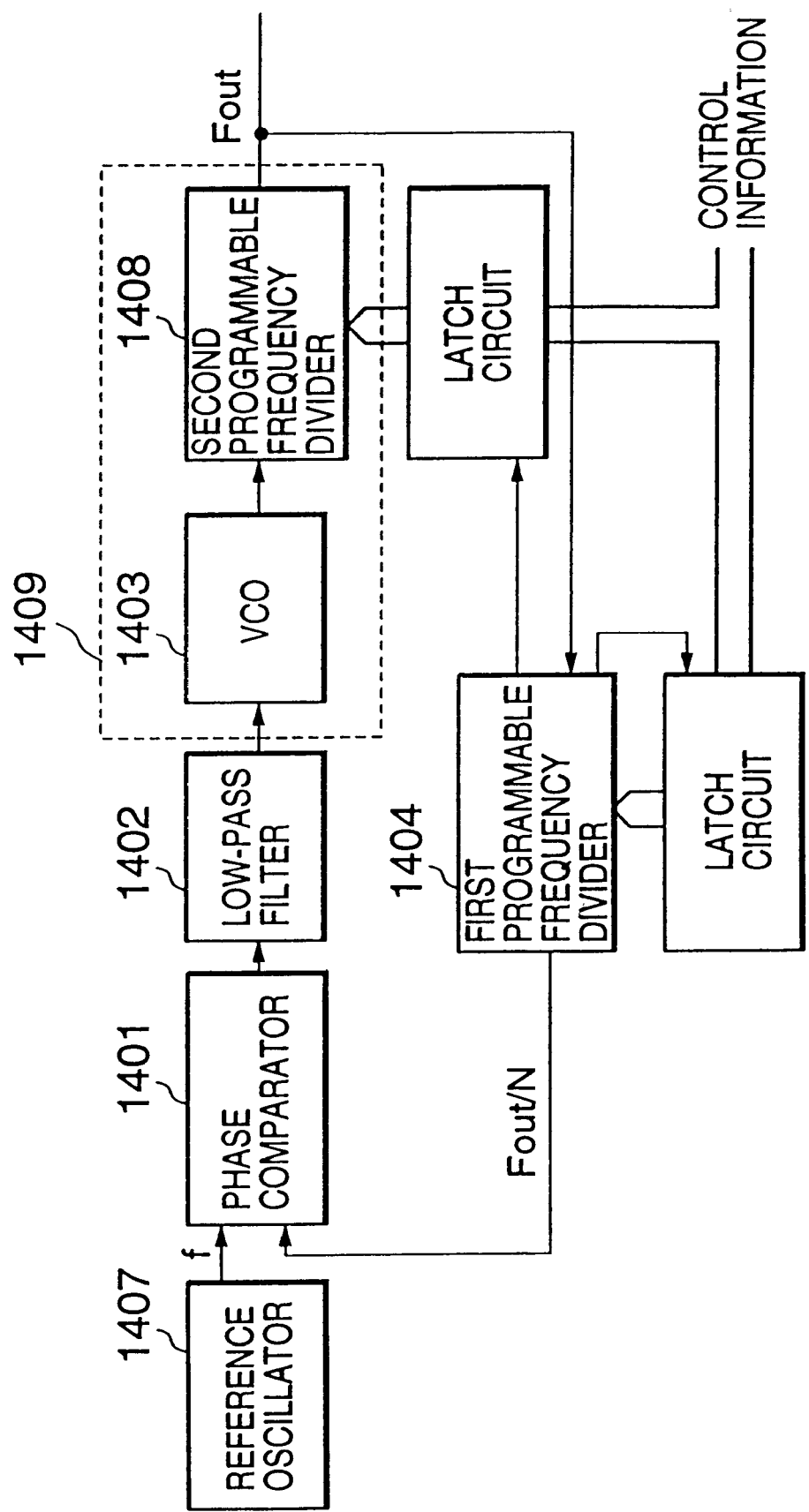
FIG. 3 is a block diagram schematically showing the overall arrangement of a PLL circuit according to the third prior art.
Figure 13:
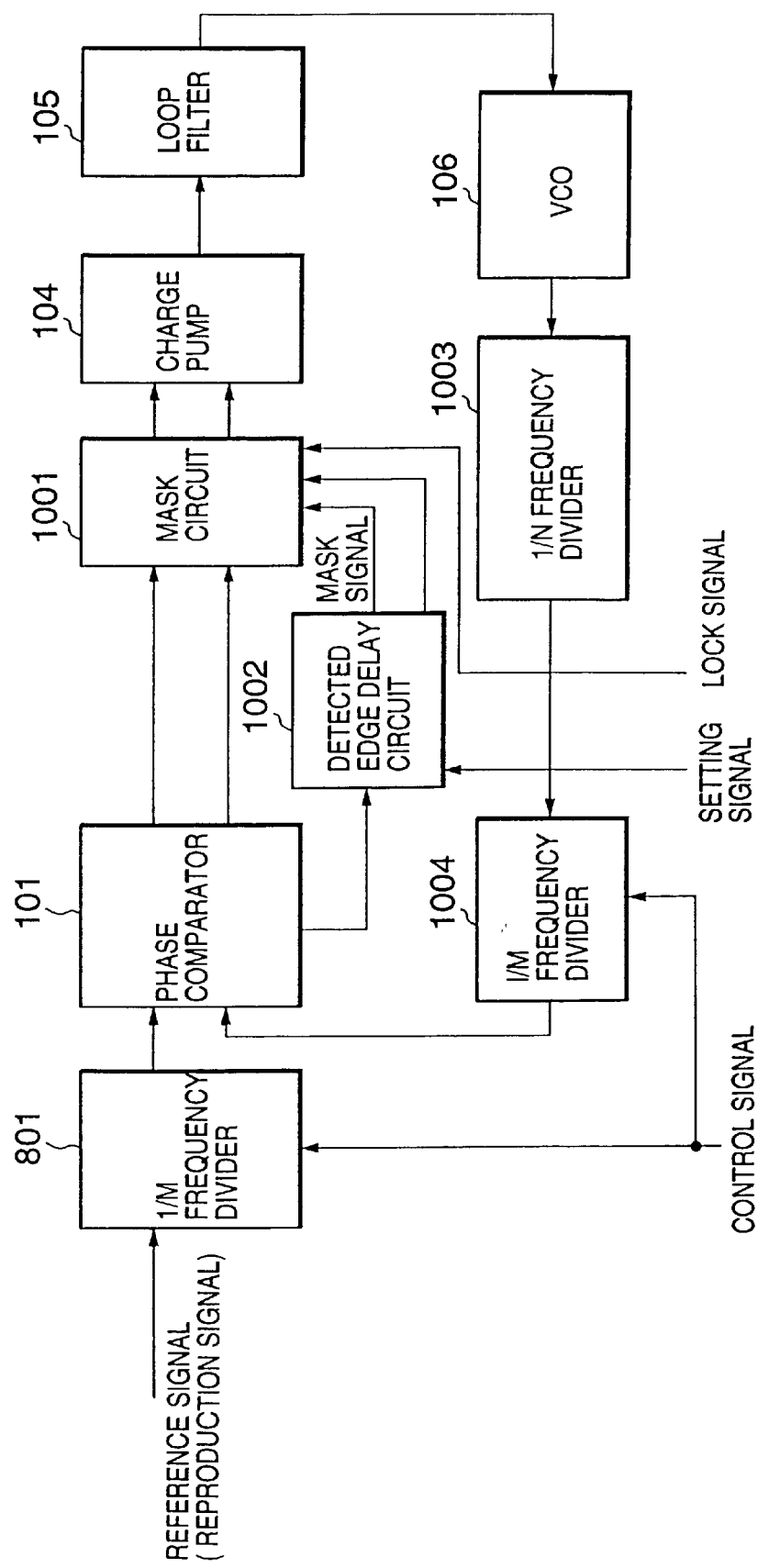
FIG. 13 is a block diagram schematically showing the overall arrangement of a PLL circuit according to the fourth embodiment of the present invention.

In the PLL circuit shown in FIG. 13, 1/M frequency dividers 801 and 1004, a mask circuit 1001, and a detected edge delay circuit 1002 are added to the phase comparator 101, the charge pump 104, the loop filter 105, and the VCO 106 which constitute the PLL circuit shown in FIG. 1. A 1/N frequency divider 1003 shown in FIG. 13 is a frequency divider having the same function as that of the frequency divider 107 shown in FIG. 4.

The detected edge delay circuit 1002 detects the leading or trailing edge of an input reproduction signal and delays the pulse signal by an arbitrary time to generate a MASK signal. When the delay time or pulse width of the pulse signal is controlled by a setting signal, the loop gain of the PLL circuit can be set at a desired value.

The mask circuit 1001 masks a phase error signal output from the phase comparator 101 using the MASK signal generated by the detected edge delay circuit 1002. As described above, when the mask operation of the mask circuit is turned on/off in accordance with a LOCK signal, a PLL circuit having different loop gains for the locked and unlocked states can be realized.

When the reproduction signal (reference signal) is divided by M using the 1/M frequency divider 801, the loop gain can be finely set independently of whether the reproduction signal (reference signal) is a signal having change points at irregular time intervals or a signal changing at a predetermined time interval.

Figure 14:
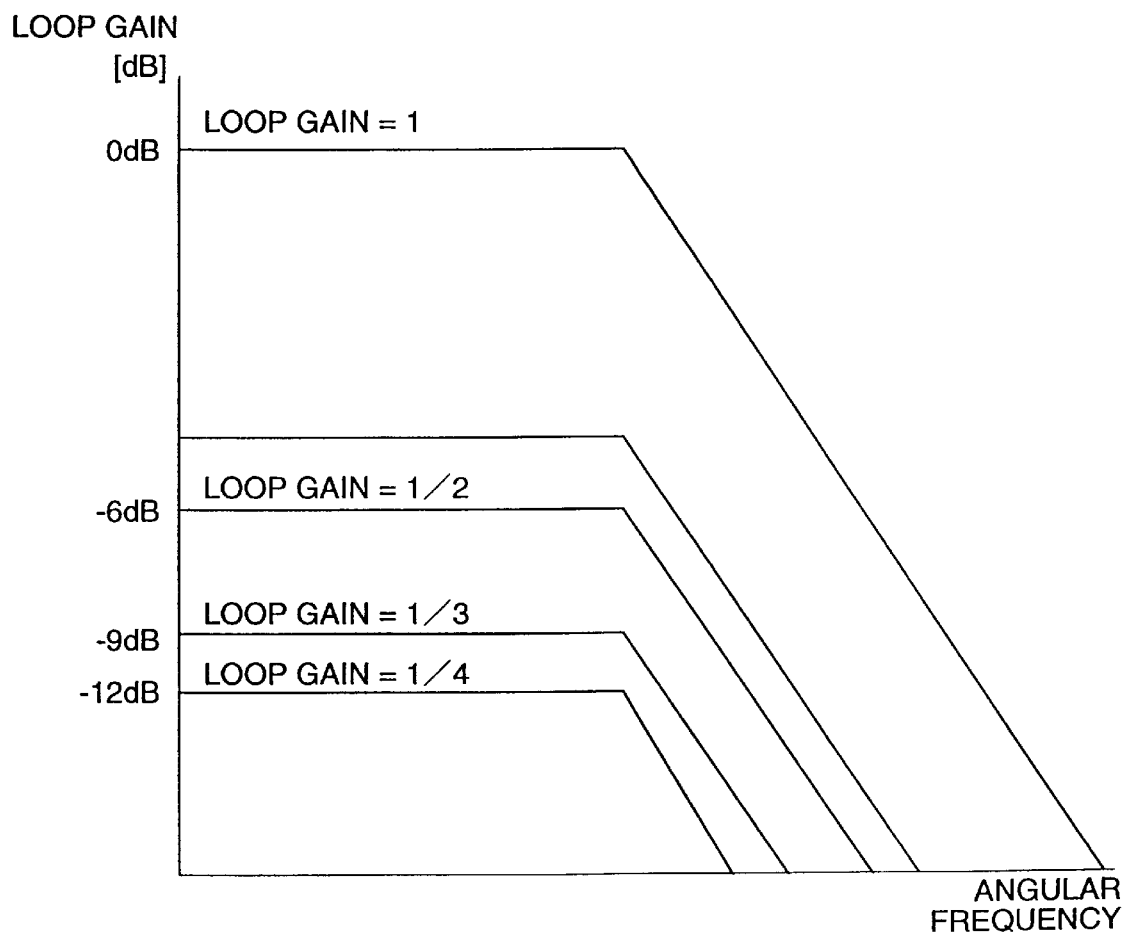
FIG. 14 is a graph showing the relationship between the angular frequency and the loop gain of the PLL circuits according to the present invention.

FIG. 14 is a board diagram showing the relationship between the angular frequency and the loop gain when the loop gains of all PLL circuits of the present invention are changed. Assume that a loop gain of 1 is given as 0 dB. Lowering the loop gain to ½, ⅓, and ¼ means that the loop gain lowers to −6 dB, −9 dB, and −12 dB, respectively.

In the above description, i.e., in the description of the first to fourth embodiments, the mask gate 103 or the mask circuit 1001 is separated from the charge pump 104. However, when a MOS transistor or an analog switch is connected to the source or drain side of the charge pump 104, the mask gate 103 or the phase comparator 101 and the charge pump 104 can be formed as one circuit block.

In addition, the output form of the UP signal and the DOWN signal is not limited to that described in the above embodiments. Any binary pulse signal can be easily used for the PLL circuit of the present invention.

What is claimed is:

1. A PLL circuit comprising:
   a phase comparator for detecting a phase difference between a reference signal having a predetermined frequency or a reproduction signal having signal change points at irregular time intervals and a signal to be compared and outputting a phase error signal and at least one other signal; and
   mask means for either transmitting or blocking the phase error signal in accordance with said at least one other signal and the signal to be compared.

2. A PLL circuit comprising:
   a phase comparator for detecting a phase difference between a reference signal having a predetermined frequency or a reproduction signal having signal change points at irregular time intervals and a signal to be compared and outputting a phase error signal; and
   mask means for either transmitting or blocking the phase error signal using a signal obtained by delaying the reference signal or the reproduction signal by an arbitrary time.

3. A circuit according to claim 1, wherein the phase comparator includes a first shift register comprising cascade-connected flip-flops to which the reference signal or the reproduction signal is input, and the mask means includes a second shift register comprising cascade-connected flip-flops to which an output from the first shift register is input, and
   wherein the mask means further includes
      a first exclusive OR gate which receives an output from an arbitrary one of the flip-flops constituting the first shift register and an output from an arbitrary one of the flip-flops constituting the second shift register, and
      a second exclusive OR gate which receives an output from an arbitrary one of the flip-flops constituting the second shift register and an output from another one of the flip-flops constituting the second shift register, and
   wherein the mask means either transmits or blocks the phase error signal based on output signals from the first and second exclusive OR gates.

4. A circuit according to claim 1, wherein the phase comparator includes a first shift register comprising cascade-connected flip-flops to which the reference signal or the reproduction signal is input, and an exclusive OR gate which receives an output from one of the flip-flops constituting the first shift register and the reference signal or the reproduction signal and outputs the phase error signal, and
   wherein said mask means includes a toggle flip-flop for receiving the phase error signal and outputting a control signal based on which the phase error signal is transmitted or blocked.

5. A PLL circuit comprising:
   a phase comparator for detecting a phase difference between a reference signal having a predetermined frequency or a reproduction signal having signal change points at irregular time intervals and a signal to be compared and outputting a phase error signal; and
   mask means for either transmitting or blocking the phase error signal in accordance with a signal obtained by frequency-dividing the phase error signal.

6. A PLL circuit comprising:
   a phase comparator for detecting a phase difference between a reference signal having a predetermined frequency or a reproduction signal having signal change points at irregular time intervals and a signal to be compared and outputting a phase error signal and at least one other signal,
   wherein the reference signal or the reproduction signal is input to the phase comparator through a frequency divider, and the phase error signal is transmitted or blocked in accordance with said at least one other signal and the signal to be compared.

7. A circuit according to claim 1, wherein said mask means blocks part of the phase error signal when said PLL circuit is locked and transmits the phase error signal when said PLL circuit is not locked.

8. A circuit according to claim 1, wherein a period for blocking the phase error output is set based on an external control signal.

9. A PLL circuit comprising:

a phase comparator for detecting a phase difference between a signal to be compared and a reproduction signal having signal change points at irregular time intervals and outputting a phase error signal, the reproduction signal being generated from a recording medium at a time interval not less than a minimum time interval Tmin from a fall to a rise of the reproduction signal based on a sampling interval T; and mask means for blocking the phase error signal using a time interval of (Tmin−0.5 T) to (Tmin−1.5 T).

10. A circuit according to claim 2, wherein said mask means blocks part of the phase error signal when said PLL circuit is locked and transmits the phase error signal when said PLL circuit is not locked.

11. A circuit according to claim 5, wherein said mask means blocks part of the phase error signal when said PLL circuit is locked and transmits the phase error signal when said PLL circuit is not locked.

12. A circuit according to claim 2, wherein a period for blocking the phase error output is set based on an external control signal.

13. A circuit according to claim 5, wherein a period for blocking the phase error output is set based on an external control signal.

* * * * *